United States Patent [19]

Cameron et al.

[11] Patent Number: 5,170,399
[45] Date of Patent: Dec. 8, 1992

[54] REED-SOLOMON EUCLID ALGORITHM DECODER HAVING A PROCESS CONFIGURABLE EUCLID STACK

[75] Inventors: Kelly Cameron; Patrick A. Owsley, both of Moscow, Id.

[73] Assignee: Idaho Research Foundation, Inc., Moscow, Id.

[21] Appl. No.: 400,739

[22] Filed: Aug. 30, 1989

[51] Int. Cl.[5] ............... G06F 11/10; H03M 13/00
[52] U.S. Cl. ................... 371/37.1; 371/38.1; 371/39.1
[58] Field of Search ............ 371/37.1, 38.1, 39.1, 371/40.1

[56] References Cited

U.S. PATENT DOCUMENTS

| | | | |
|---|---|---|---|
| 4,649,541 | 3/1987 | Lahmeyer | 371/37.1 |
| 4,782,490 | 11/1988 | Tenengolts | 371/37.5 |
| 4,868,828 | 9/1989 | Shao | 371/37.5 |
| 4,873,688 | 10/1989 | Maki | 371/37.1 |
| 4,897,839 | 1/1990 | Yamagishi | 371/37.1 |

Primary Examiner—Robert W. Beausoliel
Assistant Examiner—Ly V. Hua
Attorney, Agent, or Firm—Haverstock, Medlen & Carroll

[57] ABSTRACT

A Reed-Solomon Galois Field Euclid algorithm error correction decoder solves Euclid's algorithm with a Euclid stack which can be configured to function as a Euclid divide or a Euclid multiply module. The decoder is able to resolve twice the erasure errors by selecting $\Gamma(x)$ and $T(x)$ as the initial conditions for $\Lambda^{(0)}(x)$ and $\Omega^{(0)}(x)$, respectively.

10 Claims, 6 Drawing Sheets (PRIOR ART)
FIG. 1

EUCLID CELL
FIG. 4

FIG. 5

TERMINAL CELL FOR EUCLID STACK 118

REED-SOLOMON EUCLID ALGORITHM DECODER HAVING A PROCESS CONFIGURABLE EUCLID STACK

FIELD OF THE INVENTION

This invention relates to the field of Galois Field Reed-Solomon decoders. More particularly, this invention relates to a Reed-Solomon decoder which solves Euclid's algorithm for correcting errors and erasures by calculating a magnitude polynomial $\Omega(x)$ a location polynomial $\Lambda(x)$ and an erasure polynomial $\Gamma(x)$ and a modified syndrome polynomial $T(x)$.

BACKGROUND OF THE INVENTION

In U.S. patent application Ser. No. 105,401 an apparatus was described for correcting errors using a Reed-Solomon decoder. In an n,k code, n is the number of symbols in a code word and K is the number of data symbols. For a Reed-Solomon code, $2t=n-k$. In U.S. patent application Ser. No. 105,401 t errors could be corrected. For a Reed-Solomon code with a specified n and k, any error condition which satisfies $2t \leq E+2V$ where E = the number of erasures and V = the number of errors which are not erasures is correctable. The apparatus disclosed in that patent solved for the error-location polynomial, $\Lambda(x)$, and the error-magnitude polynomial $\Omega(x)$ using Euclid's recursive algorithm:

$$\Omega^{(i)}(x) = -q^{(i)}(x)\Omega^{(i-1)}(x) + \Omega^{(i-2)}(x) \quad [1]$$

$$\Lambda^{(i)}(x) = -q^{(i)}(x)\Lambda^{(i-1)}(x) + \Lambda^{(i-2)}(x) \quad [2]$$

The initial conditions for that apparatus were $$\Lambda^{(-1)}(x) = 0 \quad [3]$$

$$\Lambda^{(0)}(x) = 1 \quad [4]$$

$$\Omega^{(-1)}(x) = x^{2t} \quad [5]$$

$$\Omega^{(0)}(x) = S(x) \quad [6]$$

Because of these initial conditions the apparatus is incapable of correcting any erasure errors. By changing those initial conditions to $$\Lambda^{(-1)}(x) = 0 \quad [7]$$

$$\Lambda^{(0)}(x) = \Gamma(x) \quad [8]$$

$$\Omega^{(-1)}(x) = x^{2t} \quad [9]$$

$$\Omega^{(0)}(x) = T(x) \quad [10]$$

twice as many erasure errors can be corrected. Where $\Gamma(x)$ = the erasure polynomial and $T(x)$ = a modified syndrome polynomial.

Figure 1:
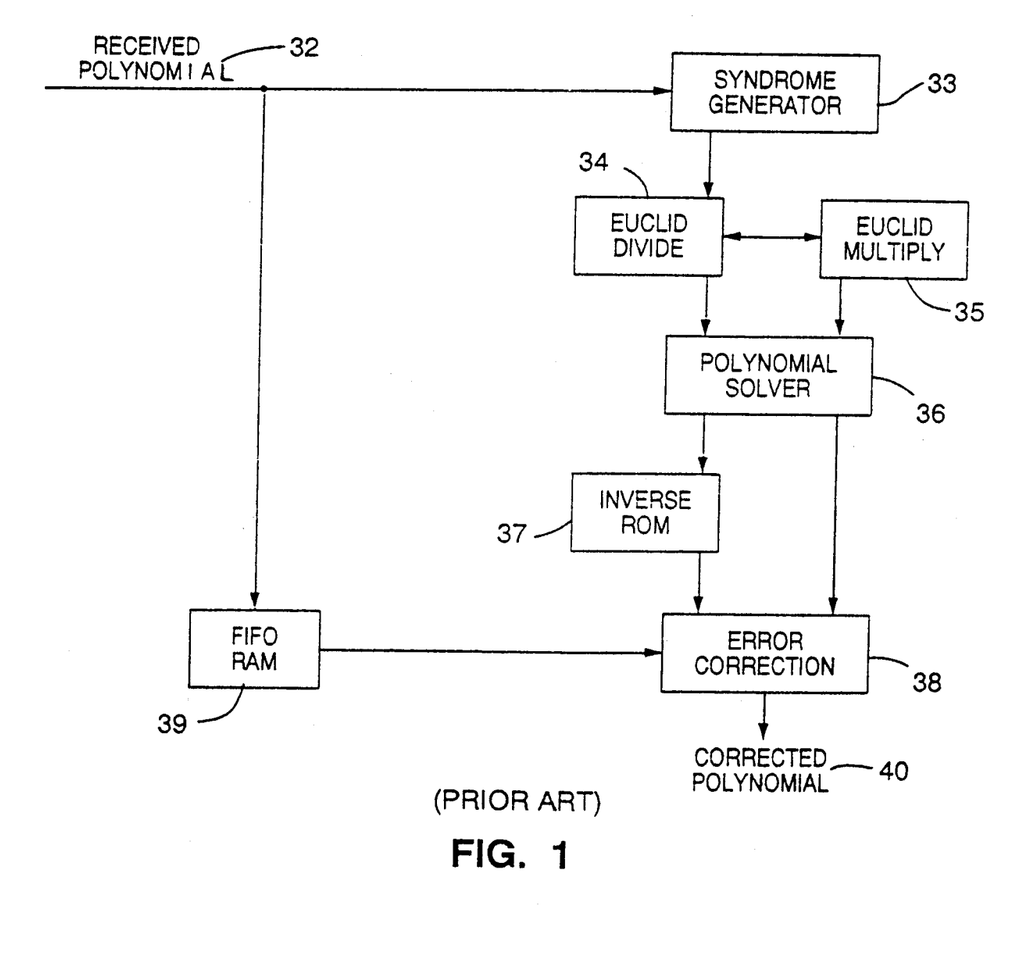
FIG. 1 shows a prior art Reed-Solomon for correcting a received polynomial using Euclid's algorithm.

The Reed-Solomon decoder in our previous patent, shown in FIG. 1, included a Euclid divide stack 34 and a Euclid multiply stack 35. These two distinct hardware stacks require separate hardware with separate functions. In a semiconductor solution for a Reed-Solomon decoder this extra hardware requires a larger die size which causes a lower manufacturing yield thereby increasing the cost of each circuit.

What is needed is a Reed-Solomon decoder utilizing Euclid's equation having initial conditions for $\Lambda^{(0)}$ of $\Gamma(x)$ and for $\Omega^{(0)}(x) = T(x)$. This will double amount of erasure errors which can be corrected. Further, this Reed-Solomon decoder could have only one Euclid stack rather than a separate Euclid divide stack and Euclid multiply stack.

SUMMARY OF THE INVENTION

A Reed-Solomon Galois Field Euclid algorithm error correction decoder solves Euclid's algorithm with a Euclid stack which can be configured to function as a Euclid divide or a Euclid multiply module. The decoder is able to resolve twice the erasure errors by selecting $\Gamma(x)$ and $T(x)$ as the initial conditions for $\Lambda^{(0)}(x)$ and $\Omega^{(0)}(x)$, respectively. Further, this same stack is capable of creating $\Gamma(x)$ or $T(x)$ with initial conditions of 1 and $S(X)$, respectively. Two identical stacks can be used in the same decoder.

DETAILED DESCRIPTION OF THE PREFERRED EMBODIMENT

The following development of BCH codes follows what can be easily found in the literature, for example G. Clark and J. Cain, Error-Correction Coding of Digital Communications, ISBN 0-306-40615-2, Plenum Press, New York, 1982 or R. Blahut, Theory and Practice of Error Control Codes, ISBN 0-201-10102-5, Addison-Wesley, Reading, Mass., 1984.

$$g(x) = \prod_{i=0}^{2t-1} (x - \alpha^{i+m0}) \quad [11]$$

where $\alpha$ is a primitive element of the field $GF(2^m)$. A code polynomial of degree less than or equal to $2^m - 1$ can be created as follows: Let i(x) be an arbitrary polynomial of degree less than or equal to $2^m - 2t - 1$. Then $$c(x) = x^{2t}i(x) + R_{g(x)}[x^{2t}i(x)] \quad [12]$$

where c(x) is a code polynomial.

Let e(x) be a polynomial that represents additive errors to the code polynomial. Then the polynomial that is received by the decoder is $r(x) = c(x) + e(x)$.

The mathematical description of the decoding operation is as follows.

1. $S_j = r(\alpha^{j-m0})$ [13]

$$S(x) = \sum_{j=0}^{2t-1} S_j x^j \quad [14]$$

where $S_j$ is the partial syndrome and S(x) is the syndrome polynomial described in U.S. patent application Ser. No. 105,401.

2. $S(x)\Lambda(x) = \Omega(x) \pmod{x^{2t}}$ [15]

3. Let $i_0$ through $i_{E-1}$ indicate erasure locations. Then for the erasure polynomial $\Gamma(x)$:

$$\Gamma(x) = (\alpha^{i_0}x - 1)(\alpha^{i_1}x - 1) \ldots (\alpha^{i_{E-1}}x - 1)$$ [16]

$$T(x) = S(x)\Gamma(x) \bmod x^{2t}$$ [17]

$T(x)$ is a modified syndrome polynomial which allows finding erasures of data rather than just errors.

4. A recursion for finding the magnitude polynomial for erasures is $$\Omega^{(i)}(x) = -q^{(i)}(x)\Omega^{(i-1)}(x) + \Omega^{(i-2)}(x)$$ [18]

and for the location polynomial for erasures is $$\Lambda^{(i)}(x) = -q^{(i)}(x)\Lambda^{(i-1)}(x) + \Lambda^{(i-2)}(x)$$ [19]

These equations are solved for the initial conditions of:

$$\Lambda^{(-1)}(x) = 0$$ [20]

$$\Lambda^{(0)}(x) = \Gamma(x)$$ [21]

$$\Omega^{(-1)}(x) = x^{2t}$$ [22]

$$\Omega^{(0)}(x) = T(x)$$ [23]

The recursion is continued until the degree of $\Omega^{(i)}(x)$ is less than $(2t-E)/2$. At that point, $\Omega(x) = \Omega^{(i)}(x)$ and $\Lambda(x) = \Lambda^{(i)}(x)$.

$$5.\ e_i = \begin{array}{ll} -\alpha^{i(l-m0)}\Omega(\alpha^{-i})/\Lambda'(\alpha^{-i}) & \text{for } \Lambda(\alpha^{-i}) = 0 \\ 0 & \text{for } \Lambda(\alpha^{-i}) \neq 0 \end{array}$$ [24]

A single Euclid stack according to the present invention is capable of:
1. shifting in all of syndromes at the same time in a bit-serial mode,
2. building $\Gamma(x)$,
3. building $T(x)$ from an initial condition of $S(x)$,
4. doing the $\Omega(x)$ recursion,
5. doing the $\Lambda(x)$ recursion, and
6. outputting $\Lambda(x)$ or $\Omega(x)$ coefficients at the same time in a bit-serial mode.

In order for a single stack to perform each of these functions, the appropriate data must be properly multiplexed into the stack as required. Furthermore, the control sequence that builds $\Gamma(x)$ is the same as the control sequence that builds $T(x)$. Because $\Gamma(x)$ is the initial condition for forming $\Lambda(x)$, after $\Gamma(x)$ has been created, it is automatically in the right position in the stack. Similarly, after $T(x)$ has been created, it is in the correct position for the $\Omega(x)$ recursion. Also, the control sequences for the recursions for $\Lambda(x)$ and $\Omega(x)$ is identical.

Finally, the stacks are constructed to allow codes of different error correcting capability to be run in them with identical control sequences; and upon completion, the contents of each stack is in the proper geometrical position for a parallel shift into a Chien search module.

Figure 2A:
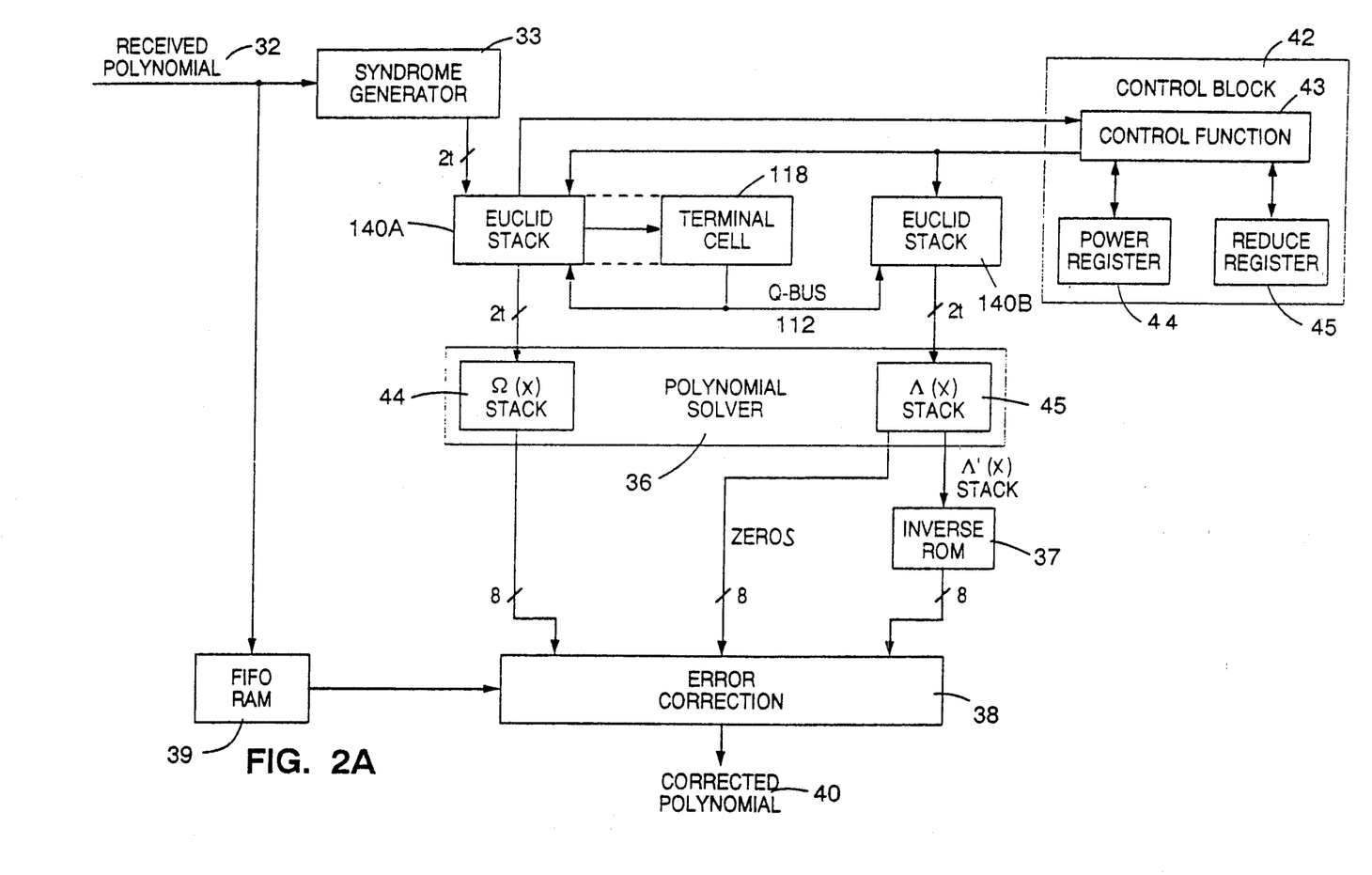
FIG. 2A shows the preferred embodiment of a Reed-Solomon decoder according to the present invention.

A block diagram of the decoder of the preferred embodiment of the present invention is shown in FIG. 2A. The system is configured to perform in a pipelined manner where several messages are being processed simultaneously as depicted next:
Message i: Syndrome Generator
Message i−1: Euclid Stack
Message i−2: Polynomial Solver and Correction
Message i−3: Data Output from Correction Module In this way, once the pipeline has been filled, the messages are decoded as fast as a new message is received. The latency of this system is on the order of 3 blocks.

The received polynomial 32 is coupled to the syndrome generator 33. The syndrome generator 33 calculates each of the 2t syndromes for the given received polynomial 32. The syndrome generator 33 is coupled to a first Euclid stack module 140A. The Euclid stack module 140A is coupled to receive control signals from the control block 42. The control block 42 contains a control function module 43 which receives a signal from the first Euclid stack module 140A. The control function module 43 is bidirectionally coupled to a POWER register 44 and a REDUCE register 45 which will be described below in relation to the control sequences.

The syndromes are input into the Euclid stack module 140A from the syndrome generator 33. The syndromes for $T(x)$ are developed by the syndrome generator 33. The Euclid stack module 140 generates the $T(x)$ polynomial. Once the $T(x)$ polynomial has been formed each element of the polynomial is in its correct location in the Euclid stack module 140 to commence the $\Omega(x)$ recursion and solve the $\Omega(x)$ polynomial in the $\Omega(x)$ stack 44 of the polynomial solver 36 to determine to magnitude of the errors.

Similarly, a second Euclid stack 140B is coupled to receive control signals from the control block 42. The two Euclid stack 140A and 140B can be identical. A terminal cell 118 is coupled to receive a control signal from the first Euclid stack 140A. Based upon the control signal, the terminal cell 118 places an appropriate signal onto the Q-bus 112. The Q-bus 112 is coupled to each of the two Euclid stacks 140A and 140B.

The second Euclid stack receives the initial condition of a 1 as an initial condition for forming $\Gamma(x)$. After $\Gamma(x)$ is formed it is used to commence the $\Lambda(x)$ recursion and then solve the $\Lambda(x)$ polynomial in the $\Lambda(x)$ stack 45 of the polynomial solver 36.

The $\Lambda(x)$ stack 45 solves for zeros of the $\Lambda(x)$ polynomial and finds the first derivative of the $\Lambda(x)$ polynomial. $\Lambda'x$ is provided to an inverse ROM 37. The magnitude, zeros, and inverse first derivative of $\Lambda'(x)$ are provided to the error correction module 38 of the decoder. This information is compared to the received polynomial 32 which has been stored in the FIFO RAM 39 to form a corrected polynomial 40.

This error correction decoder operates in a four deep pipeline. The error correction module 38 can be acting upon a first message. The polynomial solver 36 can be acting upon a second message. The Euclid stack module 41 operates upon a third message. The syndrome generator 33 can operate upon a fourth message. The FIFO RAM 39 stores the same four polynomials being acted upon as just described. The initial conditions 42 supplied to the Euclid stack modules 140A or 140B determine which procedure is currently being resolved.

The general operation can be described as follows: the received polynomial, $r(x)$, is input to both the FIFO for storage and to the syndrome calculator. The syndromes are passed to the Euclid stack modules which generates $\Omega(x)$ and $\Lambda(x)$. These polynomials are passed to Polynomial Solver. Polynomial Solver evaluates $\Omega(x)$, $\Lambda(x)$ and $\Lambda'(x)$ at $x=\beta^i$ where i takes on the values {n, n−1, ..., shortened. If $\beta^i$ is a root of $\Lambda(x)$, then a signal Zero-Found is passed to the Error Correction Module. Both $\Lambda'(x)$ and $\Omega(x)$ are evaluated for $x=\beta^i$ and these results are also presented to the Error Correction Module. The Error Correction Module determines the error magnitudes: if Zero Found is true of $x=\beta^i$, then the magnitude for location $=i \mod(2^q-1)$ is given by Eq. 24; where q is the number of bits in a code symbol; otherwise there is no error at that location. Since the Polynomial Solver calculates both $\Omega(x)$ and $\Lambda'(x)$, Error Correction only has to divide these two values. Finally the error magnitudes are exclusive-ored with the original information symbols and output.

Real time decoding is achieved. The system clock being the symbol clock is a very important feature. Therefore, this decoder can decode symbols at the same time message symbols are presented. Decoders that cannot use the symbol clock as the system clock must utilize a more complex clock system where the decoder operates at a higher clock rate than the symbol clock. Therefore, for a given technology, this decoder can operate faster than other designs which require a system clock that operates at a higher rate than the symbol clock. Moreover, operating at a symbol clock rate reduces the amount of message buffering.

Figure 2B:
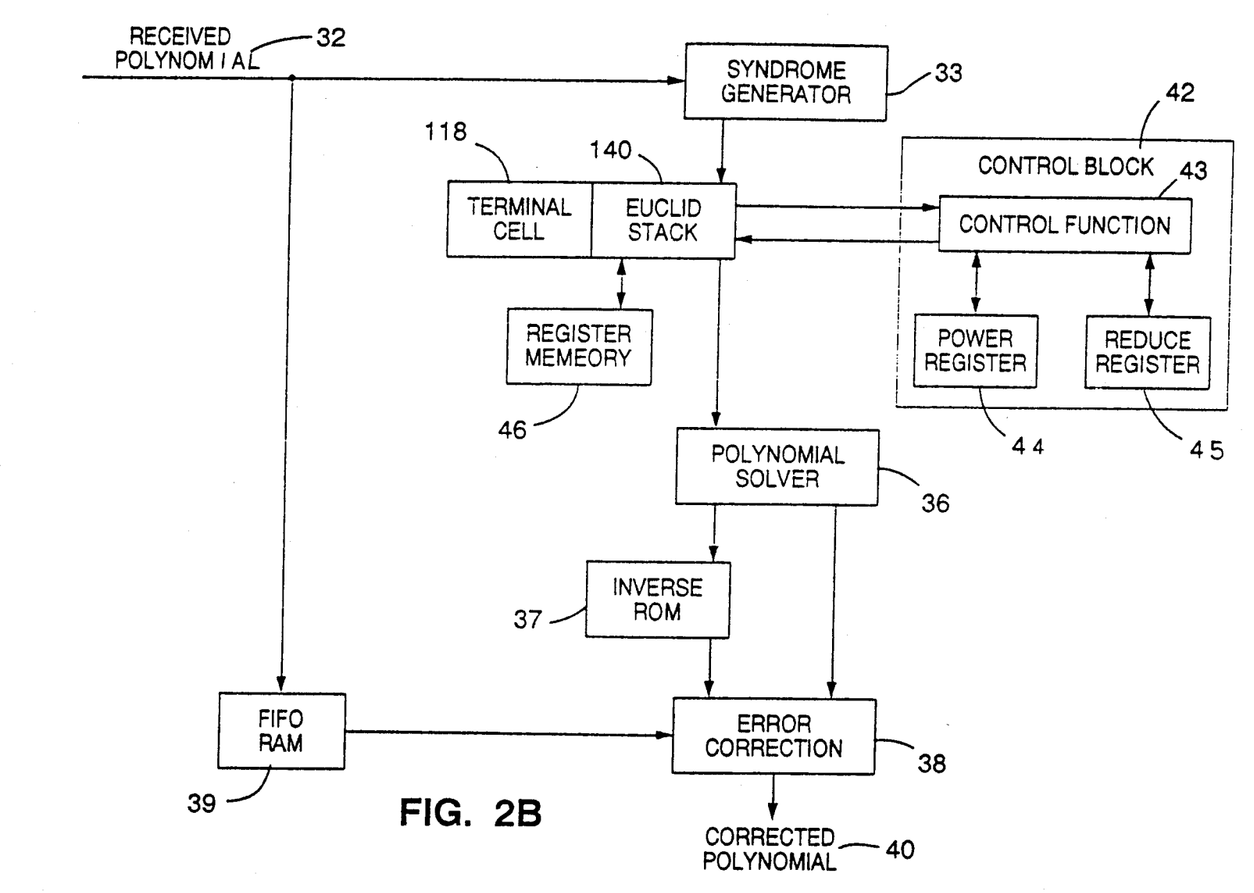
FIG. 2B shows an alternate embodiment of a Reed-Solomon decoder according to the present invention.

An alternate embodiment is shown in FIG. 2B. In this circuit, there is only one Euclid stack 140. That stack is multiplexed between the various functions which the two Euclid stack of FIG. 2A perform. A register memory 46 is used to retain that information which is not currently being used. Otherwise, the circuits of FIGS. 2A and 2B are the same.

Euclid Stack

Figure 3:
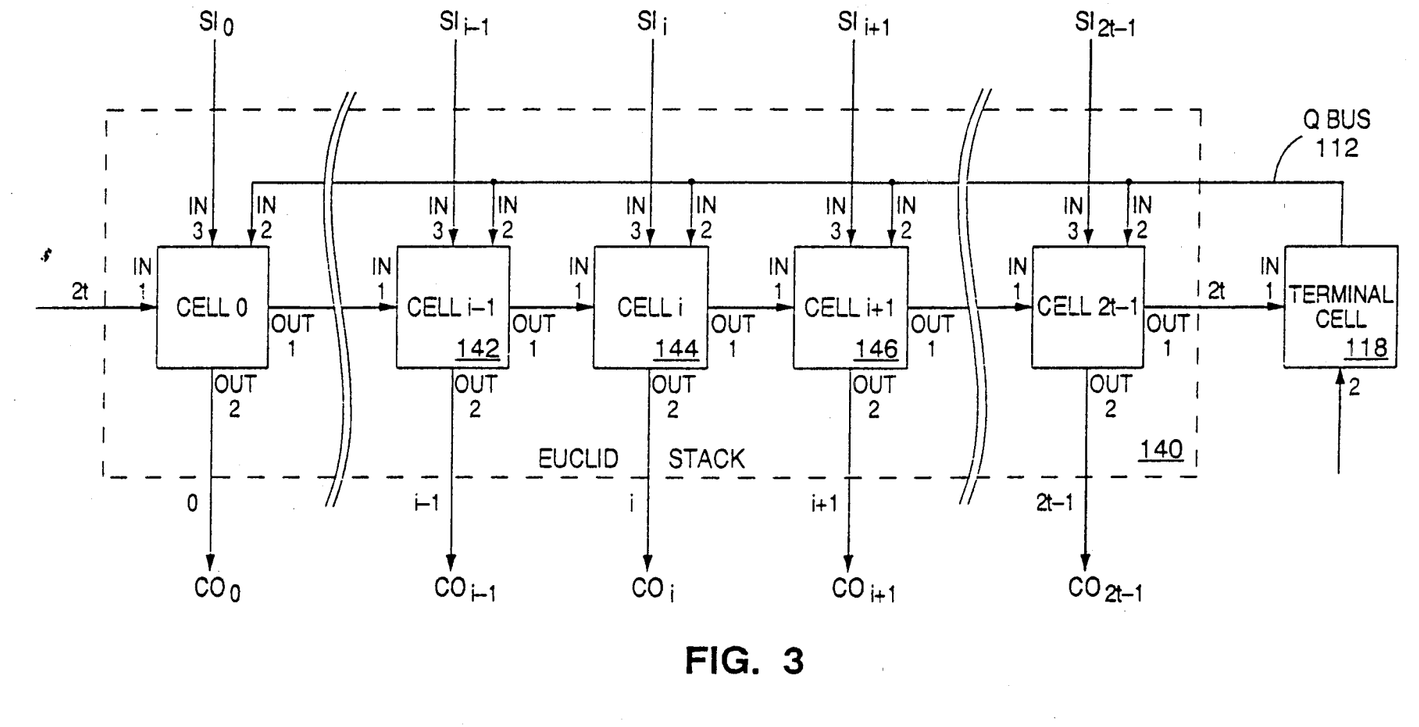
FIG. 3 shows a block diagram of the Euclid stack according to the present invention.

FIG. 3 shows the Euclid stack. The Euclid stack 140 has bit-serial inputs $SI_0$ through $SI_{2t-1}$ connecting each cell to an external source for that cell's initial condition. Either $\Lambda(x)$ or $\Omega(x)$ is resolved, depending on the cell initial conditions.

The stack has an input 2t which is connected to a constant value. An input 2t+1 is connected to the Q-bus 112. The stack has bit serial outputs $CO_0$ through $CO_{2t-1}$ (CO for Chien outputs) for outputting the results of the reduction. The stack also has output 2t. This output is connected to the first input of the terminal cell 118 if the stack is performing the $\Omega(x)$ reduction. It is not used by the stack if it is performing the $\Lambda(x)$ reduction.

Euclid Stack Cell

The Euclid stack 140 consists of 2t identical cells. Each cell has three inputs and two outputs. The first input of cell i 144 is connected to the first output of cell i−1 142. The first output of cell i 144 is connected to the first input of cell i+1 146. The second input of cell i 144 is connected to the Q-bus 112. The third input of cell i 144 is connected to input $SI_i$ of the Euclid stack 140. The second output of cell i is connected to output $CO_i$ of the Euclid stack 140. The first input of cell 0 is connected to input 2t of the Euclid stack 140. The first output of cell 2t−1 is connected to output 2t of the Euclid stack 140.

Figure 4:
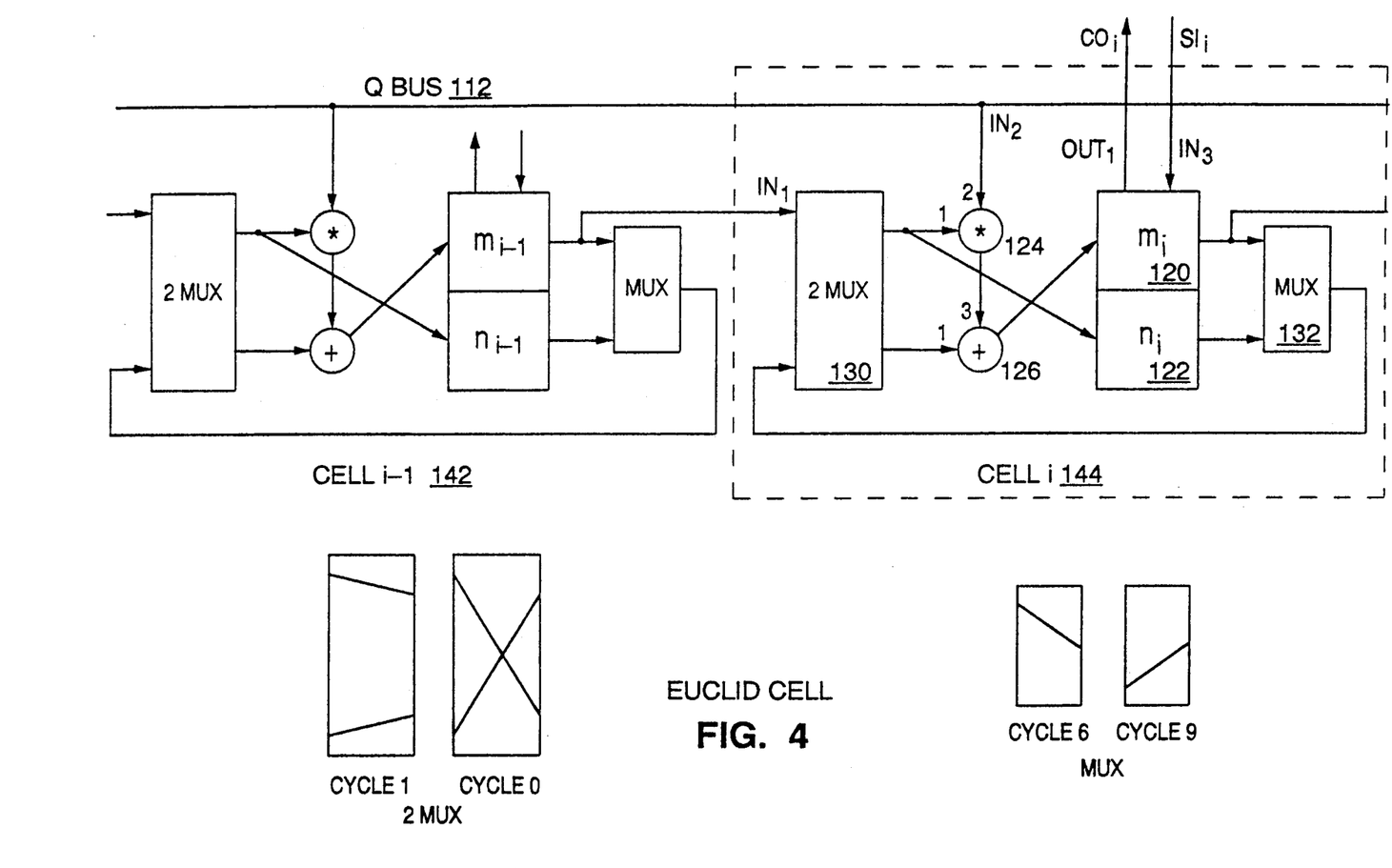
FIG. 4 shows more detail for a Euclid stack cell for the block diagram of FIG. 3.

FIG. 4 shows the Euclid stack cell. It consists of a multiplexor 2MUX 130 with a first input connected to the first input of the cell 144, a second input connected to the output of a multiplexor MUX 132, a first output connected to a first input of a Galois field general multiplier 124 and connected to the input of the register $n_i$ 122, and a second output connected to a first input of a Galois field adder 126. The Galois field multiplier 124 has a second input connected to the second input of the cell 144, and an output connected to the second input of the Galois field adder 126. The Galois field adder 126 has an output connected to a first input of the register $m_i$ 120. The register $m_i$ 120 has a second serial input connected to the third input of the cell 144, a first output connected to the first input of the multiplexor MUX 132 and connected to the first output of the cell 144, and a second serial output connected to the second output of the cell 144. The register $n_i$ 122 has an output connected to the second input of the multiplexor MUX 132.

Euclid Stack Terminal Cell

Figure 5:
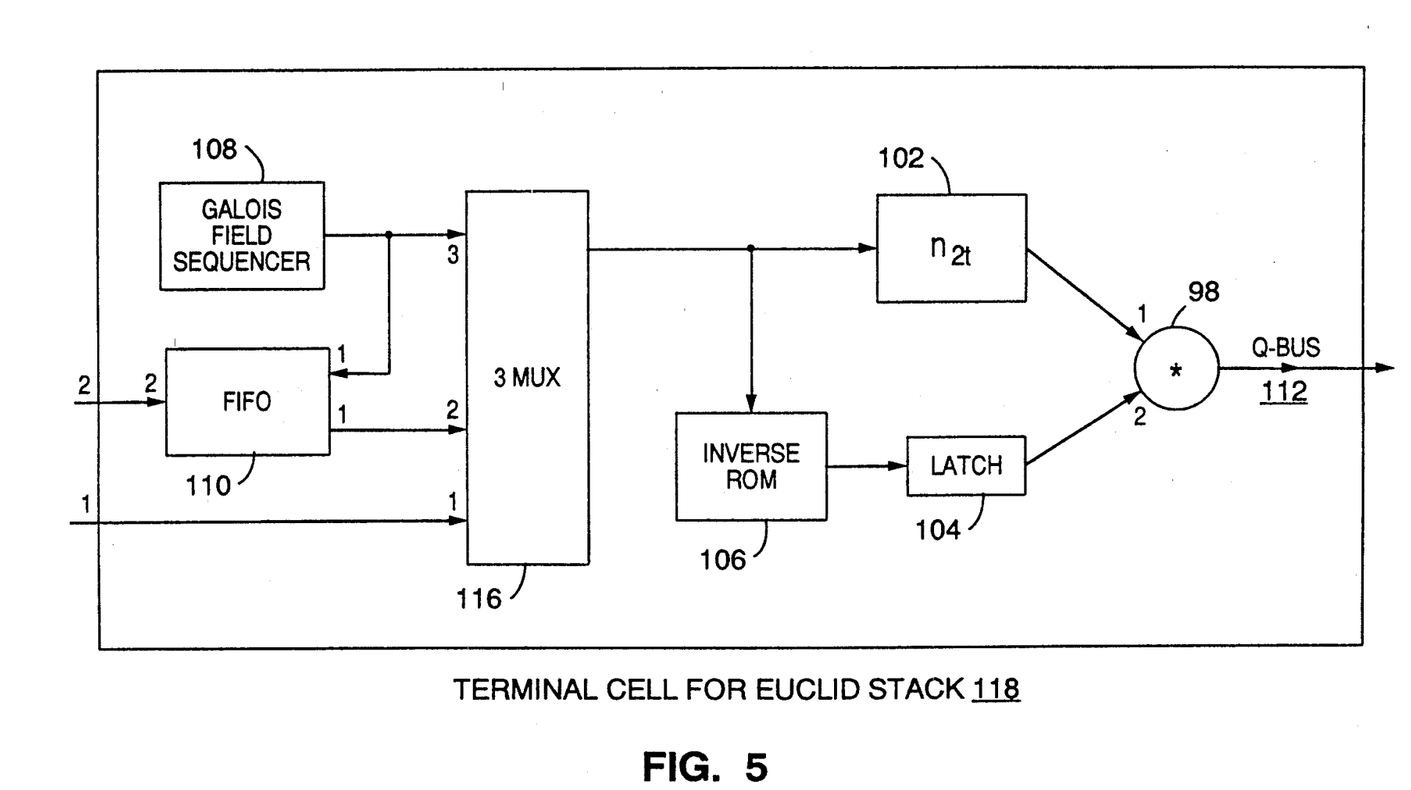
FIG. 5 shows more detail for a Euclid stack terminal cell for the block diagram of FIG. 3.

FIG. 5 shows the terminal cell that drives the Q-bus 112. The terminal cell 118 has a first input that is connected to output 2t of the Euclid stack 140 of FIG. 1 when it is configured to perform the $\Omega(x)$ reduction. It has a second input that is enabled when an erasure is flagged and disabled otherwise. The terminal cell 118 has a first output that is connected to the Q-bus 112. The terminal cell has Galois field sequencer 108 that outputs successive powers of a primitive element in a Galois field. The sequencer 108 has a first output that is connected to a third input of a multiplexor 3MUX 116 and is connected to the first input of a FIFO 110. The FIFO 110 has a second input that is connected to the second input of the terminal cell. Whenever this input is a enabled, the FIFO pushes the value of the first input into its memory. The FIFO 110 has a first output that is connected to the second input of the multiplexor 3MUX 116. The multiplexor 3MUX 116 has a first input that is connected to the first input of the terminal cell 118. It also has a first output that is connected to the first input of the register $n_{2t}$ 102 and is also connected to the first input of the inverse ROM 106. The register $n_{2t}$ has a first output that is connected to the first input of the Galois field multiplier 98. The Inverse ROM 106 has a first output that is connected to the first input of a latch 104. The inverse ROM forms the Galois field multiplicative inverse of the input. The latch 104 has a first output that is connected to the second input of the Galois field general multiplier 98. The output of the general multiplier 98 is connected to the first output of the terminal cell 118.

Control patterns

The following are the patterns of the control inputs that are used by the Euclid stack.

1. Cycle 0. The 2MUX 130 is connected in the crossover pattern and the MUX 132 passes the second input to the output. In this pattern, the output of $n_i$ 122 is connected to the first input of the galois field general multiplier 124 and to the input of $n_i$ 122. The output of $m_{i-1}$ 120 is connected to the first input of the Galois field adder 126. The Q-bus 112 is connected to the second input of the Galois field multiplier 124. The output of the Galois field multiplier 124 is connected to the second input of the Galois field adder 126 and the output of the Galois field adder 126 is connected to the input of $m_i$ 120. The output of $m_{2t-2}$ is connected to the input of the inverse ROM 106, and the output of the inverse ROM is connected to the input of the Latch 104. The output of the Latch 104 is connected to the second input of the general multiplier 98 and the output of $n_{2t-1}$ is connected to the first input of the general multiplier 98.

2. Cycle 1a. The 2MUX 130 is connected in the pass straight through pattern and the MUX 132 passes the second input to the output. In this pattern, the output of $n_i$ 122 is connected to the first input of the Galois field adder 126. The output of $m_{i-1}$ 128 is connected to the first input of the Galois field multiplier 124 and is connected to the input of $n_i$ 122. The Q-bus 112 is connected to the second input of the Galois field multiplier 124. The output of the Galois field multiplier 124 is connected to the second input of the Galois field adder 126. The output of the Galois field adder 122 is connected to the input of $m_i$ 120. The output of $n_{2t-1}$ 102 is connected to the first input of the general multiplier 98 and the output of the Latch 104 is connected to the second input of the general multiplier 98.

3. Cycle 1b. The 2MUX 130 is connected in the pass straight through pattern and the MUX 132 passes the first input to the output. In this pattern, the output of $m_i$ 120 is connected to the first input of the Galois field adder 126. The output of $m_{i-1}$ 128 is connected to the first input of the Galois field multiplier 124 and is connected to the input of $n_i$ 122. The Q-bus 112 is connected to the second input of the Galois field multiplier 124. The output of the Galois field multiplier 124 is connected to the second input of the Galois field adder 126. The output of the Galois field adder 126 is connected to the input of $m_i$ 120. The first input of general multiplier 98 is connected to the output of the $n_{2t-1}$ register 102 and the second input of the multiplier is connected to the output of the latch 104. The output of the FIFO 110 is connected to the input of the $n_{2t-1}$ register 102.

Control sequences

1. Storing the Erasures

The received polynomial, r(x), is loaded from most significant coefficient to least. Whenever a coefficient is flagged as an erasure, the contents of the Galois field sequencer 108 shown in FIG. 5 is loaded into the FIFO 110. When the last coefficient of r(x) is input, the contents of the Galois field sequencer 108 is passed through the inverse ROM 106 and placed in the latch 104.

2. Loading the syndromes and unloading $\Omega(x)$ and $\Lambda(x)$

As soon as the previous Euclid stack operation is complete, the $m_i$ registers are configured to be bit shift registers. Data is loaded serially and unloaded serially in 8 clock pulses. The results of the previous operations are unloaded at the same time as the inputs for the next operation are loaded. The $n_i$ registers have reset lines to initialize them to all zeros.

3. Building $\Gamma(x)$ and $T(x)$ $\Gamma(x)$ is described in equation EQ [16]. The procedure for forming it and the procedure for creating $T(x)$, as described in equation EQ [17] is the same except for a difference in initial conditions. Both operations require the Euclid stack defined above.

The initial conditions for building $\Gamma(x)$ are for $m_0$ to be equal to 1 and all of the other registers in the stack to be equal to 0. The initial conditions for building $T(x)$ is for the $m_i$ registers to be equal to the partial syndromes, $S_i$ defined in EQ [13]. The $n_i$ registers are all equal to 0.

There are E erasures. As was described above, there are E outputs of the Galois field sequencer stored in the FIFO and the last value of the sequencer has been passed through the inverse ROM and the value is stored in the latch represented in FIG. 5. The process of building the two polynomials consists of E repetitions of cycle 1b. For each of the cycles, the output of the general multiplier 98 drives the Q-bus 112. At the end of E repetitions of the cycle 1b, $\Gamma(x)$ is in the proper position for the $\Lambda(x)$ reduction and $T(x)$ is in the proper position for the $\Gamma(x)$ reduction.

4. Reducing $\Omega(x)$ and $\Lambda(x)$

The operation of reducing $\Omega(x)$ and $\Lambda(x)$ is identical with the exception that there is an output of the $\Omega(x)$ reduce engine that is coupled to the terminal cell 118 that drives the Q-bus 112. The operation of reducing the polynomial $\Omega(x)$ and $\Lambda(x)$ may run concurrently sharing the value on the Q-bus 112 and they share the same control cycles. The 2 cycles that will be used are 1a and 0 described above.

There are two count values that will be used to control the process. The first is REDUCE which is initialized to 2t−E. The second is POWER which is initialized to 0. The reduction process described below will continue until the value of the REDUCE counter is equal to 1 or 0. The following is a description of the complete reduction process.

(a) While $m_{2t-1}=0$ and REDUCE $\neq 0$ or 1, then increment POWER, subtract 2 from REDUCE, and do a cycle 0 with the Q-bus 112 equal to 0. If REDUCE=0 or 1, then go to STEP c, Else-if $m_{2t-1}=0$ go to STEP b.

(b) Do a cycle 1a with the Q-bus 112 connected to the output of multiplier 98. Then do a cycle 0 with the Q-bus 112 connected to the output of multiplier 98. Then, while power is not equal to zero, decrement POWER and do cycle 0 with the output of multiplier 98 connected to the Q-bus. When POWER is equal to zero, go back to STEP a.

(c) If REDUCE=1, then increment POWER and do a cycle 1b with the Q-bus 112 equal to 0. Go to STEP d.

While POWER$\neq$0, decrement Power and do a cycle 0 with the Q-bus 112 equal to 0.

At this point, the contents of the stack initialized with $T(x)$ has $\Omega(x)$ stored in the m registers.

$$\Omega(x) = \sum_{i=0}^{2t-1} m_i \quad [25]$$

The contents of the stack initialized with $\Gamma(x)$ has $\Lambda(x)$ stored in the m registers.

$$\Lambda(x) = \sum_{i=0}^{2t-1} m_i \quad [26]$$

These results are shifted out serially to the Chien search modules.

What is claimed is:

1. A Reed-Solomon Galois Field Euclid Algorithm decoder having:

a. means for receiving an encoded electrical message signal;

b. means for calculating $\Omega(x)$, a magnitude polynomial representing a portion of a magnitude of an error in the received message signal, wherein the means for calculating $\Omega(x)$ is coupled to the means for receiving;

c. means for calculating $\Lambda(x)$, a location polynomial representing a location of said error in said received message signal, wherein the means for calculating $\Lambda(x)$ is coupled to the means for receiving, said location polynomial having a first derivative polynomial;

d. means for calculating $\Gamma(x)$, an erasure polynomial, wherein the means for calculating $\Gamma(x)$ is coupled to the means for receiving;

e. means for calculating $T(x)$, a modified syndrome polynomial, wherein the means for calculating $T(x)$ is coupled to the means for receiving, and f. means for correcting the error, wherein the means for calculating $\Omega(x)$, the means for calculating $\Lambda(x)$, the means for calculating $\Gamma(x)$ and the means for calculating $T(x)$ all have identical architectures.

2. The Reed-Solomon Galois Field Euclid Algorithm decoder according to claim 1 further comprising:

a. means for calculating the first derivative polynomial of said location polynomial, said first derivative having a plurality of non-zero values, each of said non-zero values having an inverse;

b. means for calculating said inverse values; and c. means for multiplying each of said inverse values with a value of said magnitude polynomial for forming a correction polynomial.

3. The apparatus according to claim 1 wherein the means for calculating $\Omega(x)$, the means for calculating $\Lambda(x)$, the means for calculating $\Gamma(x)$ and the means for calculating $T(x)$ are the same hardware module multiplexed for forming the polynomials sequentially.

4. The apparatus according to claim 1 further comprising a Euclid stack coupled to the means for calculating a magnitude polynomial, wherein the Euclid stack comprises 2t cells, $cell_0$ through $cell_{2t-1}$, wherein $cell_i$ is a representative cell, $cell_i$ having:

a. a first multiplexor coupled to receive a first input from $cell_{i-1}$;

b. a first Galois Field general multiplier coupled to receive an output from the first multiplexor;

c. a Q-bus coupled to an input of the first multiplier;

d. a Galois Field general adder coupled to receive an output from the first multiplexor and the first multiplier;

e. a first register coupled to receive a first $cell_i$ input and to supply a $cell_i$ output and coupled to receive a an input from the adder;

f. a second register coupled to receive an output from the first multiplexor; and g. a second multiplexor coupled to receive an output from the first register and the second register and coupled to supply an output to the first multiplexor.

5. The apparatus according to claim 4 further comprising at terminal cell comprising:

a. a FIFO coupled to receive a control input signal from a control block;

b. a Galois Field sequencer coupled to provide a signal to the FIFO;

c. a third multiplexor coupled to receive a signal from the sequencer, the FIFO and from $cell_{2t-1}$;

d. a register coupled to receive a signal from the third multiplexor;

e. an inverse ROM coupled to receive a signal from the third multiplexor for forming an inverse;

f. a latch coupled to receive the inverse from the inverse ROM; and g. a second Galois Field general multiplier coupled to receive a signal from the register and from the latch and coupled to to the Q-bus.

6. The Galois Field Euclid Algorithm apparatus according to claim 1 which doubles the erasure errors that can be solved by using the initial conditions:

$$\Lambda^{(-1)}(x) = 0$$

$$\Lambda^{(0)}(x) = \Gamma(x)$$

$$\Omega^{(-1)}(x) = x^{2t}$$

$$\Omega^{(-1)}(x) = T(x)$$

where $\Gamma(x) = (\alpha^0 x - 1)^j (\alpha^1 x - 1)^j \ldots (\alpha^{E-1} x - 1)^j$
and
$T(x) = S(x)\Gamma(x) \bmod x^{2t}$.

7. A Reed-Solomon Galois Field Euclid Algorithm decoder for correcting an error in a received electrical message signal comprising a single Euclid stack means for forming an erasure polynomial $\Gamma(x)$, a magnitude polynomial $\Omega(x)$, a modified syndrome polynomial $T(x)$ and a location polynomial $\Lambda(x)$ wherein a control sequence for forming $\Gamma(x)$ is the same as a control sequence for forming $T(x)$ and a control sequence for forming $\Omega(x)$ is the same as a control sequence for forming $\Lambda(x)$ and further wherein $\Gamma(x)$ comprises a set of initial conditions for forming $\Lambda(x)$ and is automatically in a correct position in the stack for performing a $\Lambda(x)$ recursion and similarly wherein $T(x)$ comprises one of the initial conditions for forming $\Lambda(x)$ and is automatically in the correct position in the stack for performing a $\Omega(x)$ recursion wherein the decoder further comprises:

a. means for calculating a magnitude polynomial representing a portion of a magnitude of said error in said received electrical message signal;

b. means for calculating a location polynomial representing a location of said error in said received electrical message signal said location polynomial having a first derivative polynomial having an identical architecture to the means for calculating a magnitude polynomial;

c. means for calculating the first derivative polynomial of said location polynomial, said first derivative having a plurality of non-zero values, each of said non-zero values having an inverse;

d. means for calculating said inverse values;

e. means for multiplying each of said inverse values with a value of said magnitude polynomial for forming a correction polynomial; and f. means for correcting the received electrical message signal.

8. The apparatus according to claim 7 wherein the means for calculating a magnitude polynomial and the means for calculating a location polynomial are the same hardware module multiplexed for forming the magnitude polynomial and the location polynomial sequentially.

9. The apparatus according to claim 7 further comprising a Euclid stack coupled to the means for calculating a magnitude polynomial, wherein the Euclid stack comprises 2t cells, $cell_0$ through $cell_{2t-1}$, wherein $cell_i$ is a representative cell, $cell_i$ having:

a. a first multiplexor coupled to receive a first input from $cell_{i-1}$;

b. a first Galois Field general multiplier coupled to receive an output from the first multiplexor;

c. a Q-bus coupled to supply a signal to the first multiplier;
d. a Galois Field general adder coupled to receive an output from the first multiplexor and the first multiplier;
e. a first register coupled to receive a first $cell_i$ input and to supply a $cell_i$ output and coupled to receive a an input from the adder;
f. a second register coupled to receive an output from the first multiplexor; and
g. a second multiplexor coupled to receive an output from the first register and the second register and coupled to supply an output to the first multiplexor.

10. The apparatus according to claim 9 further comprising a terminal cell comprising:

a. a FIFO coupled to receive a control input signal from a control block;
b. a Galois Field sequencer coupled to provide a signal to the FIFO;
c. a third multiplexor coupled to receive a signal from the sequencer, the FIFO and from $cell_{2t-1}$;
d. a register coupled to receive a signal from the third multiplexor;
e. an inverse ROM coupled to receive a signal from the third multiplexor for forming an inverse;
f. a latch coupled to receive the inverse from the inverse ROM; and
g. a second Galois Field general multiplier coupled to receive a signal from the register and from the latch and coupled to the supply a signal to the Q-bus.

* * * * *

UNITED STATES PATENT AND TRADEMARK OFFICE
CERTIFICATE OF CORRECTION

PATENT NO. : 5,170,399  
DATED : 12/8/92  
INVENTOR(S) : KELLY CAMERON ET AL.

Page 1 of 2

It is certified that error appears in the above-identified patent and that said Letters Patent is hereby corrected as shown below:

On the cover page, in the Abstract reference block [57], lines 4-5, please delete "decorder" and insert --decoder--.

In column 2, line 45, Equation [11], please delete
$$"g(x) = \prod_{i=0}^{2t-1} (x - \alpha^{i+m0})"$$
and insert
$$--g(x) = \prod_{i=0}^{2t-1} (x - \alpha^{i+m_0})--.$$

In column 2, Line 62, Equation [13], please delete "$S_j = r(\alpha^{j-m0})$" and insert --$S_j = r(\alpha^{j-m_0})$--.

In column 3, Line 7, Equation [16], please delete "$\Gamma(x) = (\alpha^{i0}x - 1)(\alpha^{i1}x - 1)...(\alpha^{iB-1}x-1)$" and insert-- $\Gamma(x) = (\alpha^{i_0}x - 1)(\alpha^{i_1}x - 1)...(\alpha^{i_s-1}x-1)$ --.

In column 3, Line 20, Equation [19], please delete "$\Lambda^{(i)}(x) = -q^{(i)}(x)\Lambda^{i-1}(x) + \Lambda^{(i-2)}(x)$" and insert --$\Lambda^{(i)}(x) = -q^{(i)}(x)\Lambda^{(i-1)}(x) + \Lambda^{(i-2)}(x)$--.

In column 3, line 35, Equation [24], please delete
"5. $e_i = -\alpha^{i(1-m0)}\Omega(\alpha^{-i})/\Lambda'(\alpha^{-i})$ for $\Lambda(\alpha^{-i}) = 0$  
　　　0 　　　　　　　　　　　　 for $\Lambda(\alpha^{-i}) \neq 0$" and insert
--5. $e_i = -\alpha^{i(1-m_0)}\Omega(\alpha^{-i})/\Lambda'(\alpha^{-i})$ for $\Lambda(\alpha^{-i}) = 0$  
　　　0 　　　　　　　　　　　　 for $\Lambda(\alpha^{-i}) \neq 0$--.

UNITED STATES PATENT AND TRADEMARK OFFICE
CERTIFICATE OF CORRECTION

PATENT NO. : 5,170,399

DATED : 12/8/92

INVENTOR(S) : KELLY CAMERON ET AL.

It is certified that error appears in the above-identified patent and that said Letters Patent is hereby corrected as shown below:

In column 5, line 3, after "...," and before "shortened", please insert --(n-N)} where n-N is the amount that the code has been--.

In column 6, line 38, please delete ",".

In column 7, line 55, please delete "[17] is" and insert --[17] is--.

In column 8, line 38, please delete "While" and insert --(d) While--.

In column 9, line 45, please delete "a".

In column 9, line 53, please delete "at" and insert --a--.

In column 9, line 68, please delete "to".

In column 11, line 8, please delete "a".

In column 12, line 15, please delete "the".

Signed and Sealed this

Twenty-third Day of November, 1993

BRUCE LEHMAN

*Attest:*

*Attesting Officer*   *Commissioner of Patents and Trademarks*